(12) United States Patent
Yoon et al.

(10) Patent No.: US 6,774,097 B2
(45) Date of Patent: Aug. 10, 2004

(54) RESIST STRIPPER COMPOSITION

(75) Inventors: Suk-Il Yoon, Kyungki-do (KR);
Young-Woong Park, Suwon (KR);
Chang-Il Oh, Seongnam (KR);
Sang-Dai Lee, Kyungki-do (KR);
Chong-Soon Yoo, Kyungki-do (KR)

(73) Assignee: Dongjin Semichem Co., Ltd., Incheon (KR)

( * ) Notice: Subject to any disclaimer, the term of this patent is extended or adjusted under 35 U.S.C. 154(b) by 0 days.

(21) Appl. No.: 10/258,823

(22) PCT Filed: Apr. 25, 2001

(86) PCT No.: PCT/KR01/00692

§ 371 (c)(1),
(2), (4) Date: Oct. 25, 2002

(87) PCT Pub. No.: WO01/82002

PCT Pub. Date: Nov. 1, 2001

(65) Prior Publication Data

US 2003/0100459 A1 May 29, 2003

(30) Foreign Application Priority Data

Apr. 26, 2000 (KR) .......................................... 2000-22221

(51) Int. Cl.[7] .......................... G03C 11/12; G03C 5/00; C11D 7/50; C11D 7/32
(52) U.S. Cl. ........................ 510/176; 510/175; 510/202; 510/212; 510/499; 134/38

(58) Field of Search .................................. 510/175, 176, 510/202, 212, 499, 505; 430/331, 329; 134/38, 40, 1.3, 3; 438/756

(56) References Cited

U.S. PATENT DOCUMENTS

| 5,597,420 A | | 1/1997 | Ward |
| 5,707,947 A | | 1/1998 | Ward et al. |
| 5,759,973 A | * | 6/1998 | Honda et al. ............... 510/176 |
| 5,798,323 A | * | 8/1998 | Honda et al. ............... 510/176 |
| 5,846,695 A | | 12/1998 | Iwata et al. |
| 5,911,835 A | * | 6/1999 | Lee et al. .................... 134/1.3 |
| 5,989,353 A | * | 11/1999 | Skee et al. .................... 134/2 |

FOREIGN PATENT DOCUMENTS

| EP | 0828197 A1 | 3/1998 |
| GB | 2342727 | 4/2000 |
| JP | 7028254 | 1/1995 |

* cited by examiner

Primary Examiner—Gregory Webb
(74) Attorney, Agent, or Firm—Baker Botts LLP

(57) ABSTRACT

The present invention relates to a resist stripper composition that is used to remove resists during semiconductor device manufacturing processes such as for large size integrated circuits, very large size integrated circuits, etc. The resist stripper composition comprises 3 to 10 wt % of an organic amine compound, 30 to 60 wt % of a solvent selected from a group consisting of DCMAc, DMF, DMI, NMP, etc., 30 to 60 wt % of water, 1 to 10 wt % of catechol, resorcin or a mixture thereof and 1 to 10 wt % of a C4–6 straight polyhydric alcohol.

4 Claims, 2 Drawing Sheets

RESIST STRIPPER COMPOSITION

CROSS REFERENCE TO RELATED APPLICATION

This application is based on application No. 2000-22221 filed in the Korean Industrial Property Office on Apr. 26, 2000, the content of which is incorporated hereinto by reference.

BACKGROUND OF THE INVENTION (a) Field of the Invention

The present invention relates to a resist stripper composition for removing resists during a manufacturing process of semiconductor devices, such as large size integrated circuits (LSI) and very large size integrated circuits (VLSI).

(b) Description of the Related Art

Generally, manufacturing processes of semiconductor devices employ dozens of lithography processes which comprise forming a resist pattern on a conductive layer formed on a semiconductor substrate, and then etching a part of the conductive layer that is not covered by the pattern using the pattern as a mask to remove the part, thereby forming a conductive layer pattern. The resist pattern used as a mask must be removed from the conductive layer by a resist stripper during a stripping process after the conductive layer pattern forming process. However, since in recent very large size integrated circuit semiconductor manufacturing, a dry etching process for forming conductive patterns has been conducted, it becomes difficult to remove resists in the subsequent stripping process.

In the dry etching process, which replaces a wet etching process using liquid phase composition of mixed acids, the etching process is conducted using a gas phase-solid phase reaction between plasma etching gases and layers such as the conductive layer. Dry etching forms the main-stream of recent etching processes, because it is easy to control and can obtain sharp patterns. However, since during the dry etching process, ions and radicals of plasma etching gases cause complex chemical reactions with the resist film and rapidly cure the resist, it becomes difficult to remove the resist. Particularly, in the case of dry etching of metal conductive layers such as aluminum, aluminum alloy and titanium nitride, modified and cured resist polymers are generated on side wall parts and they are difficult to remove during the stripping process.

A variety of resist stripper compositions comprising organic amine compounds and organic solvents have been suggested for the stripping process, and particularly, a resist stripper composition comprising monoethanolamine (MEA) as an essential ingredient is most commonly used.

As examples, a two-component system resist stripper composition comprising a) organic amine compounds such as monoethanolamine (MEA), 2-(2-aminoethoxy)ethanol (AEE), etc., and b) polar solvents such as N,N-dimethylacetamide (DMAc), N,N-dimethylformamide (DMF), N-methylpyrrolidone (NMP), dimethylsulfoxide (DMSO), carbitol acetate, methoxyacetoxypropane, etc. (U.S. Pat. No. 4,617,251); a two-component system resist stripper composition comprising a) organic amine compounds such as monoethanolamine (MEA), monopropanolamine, methylamylethanol, etc., and b) amide solvents such as N-methylacetamide (Mac), N,N-dimethylacetamide (DMAc), N,N-dimethylformamide (DMF), N,N-dimethylpropionamide, N,N-diethylbutylamide, N-methyl-N-ethylpropionamide, etc. (U.S. Pat. No. 4,770,713); a two-component system resist stripper composition comprising a) organic amine compounds such as monoethanolamine (MEA), and b) non-protonic polar solvents such as 1,3-dimethyl-2-imidazolidinon (DMI), 1,3-dimethyl-tetrahydropyrimidinon, etc. (German Laid-Open Patent Application No. 3,828,513); a resist stripper composition comprising a) ethylene oxide—introduced alkylene polyamines of alkanol amines such as monoethanolamine (MEA), diethanol amine (DEA), triethanolamine (TEA), etc., and ethylenediamine, b) sulfone compounds such as sulforane, etc., and c) glycol monoalkyl ethers such as diethylene glycol monoethyl ether, diethylene glycol-monobutyl ether, etc., in a specific ratio (Japanese Laid-open Patent Publication No. Sho 62-49355); a resist stripper composition comprising a) water soluble amines such as monoethanol amine (MEA), diethanolamine (DEA), etc., and b) 1,3-dimethyl-2-imidazolidinone (Japanese Laid-open Patent Publication No. Sho 63-208043); a positive resist stripper composition comprising a) amines such as monoethanolamine (MEA), ethylenediamine, piperidine, benzyl amine, etc., b) polar solvents such as DMAc, NMP, DMSO, etc., and c) a surfactant (Japanese Laid-open Patent Publication No. Sho 63-231343); a positive resist stripper composition comprising a) nitrogen-containing organic hydroxy compounds such as monoethanolamine (MEA), b) one or more solvents selected from diethylene glycol monoethyl ether, diethyleneglycol dialkyl ether, γ-butyrolactone and 1,3-dimethyl-2-imidazolinone, and c) DMSO in a specific ratio (Japanese Laid-open Patent Publication No. Sho 64-42653); a positive resist stripper composition comprising a) organic amine compounds such as monoethanol amine (MEA), etc., b) a non-protonic polar solvent such as diethylene glycol monoalkyl ether, DMAc, NMP, DMSO, etc., and c) a phosphate ester surfactant (Japanese Laid-open Patent Publication No. Hei 4-124668); a resist stripper composition comprising a) 1,3-dimethyl-2-imidazolinon (DMI), b) dimethylsulfoxide (DMSO), and c) organic amine compounds such as monoethanol amine (MEA), etc. (Japanese Laid-open Patent Publication No. Hei 4-350660); and a resist stripper composition comprising a) monoethanol amine (MEA), b) DMSO, and c) catechol (Japanese Laid-open Patent Publication NO. Hei 50281753) have been suggested and these resist stripper compositions show relatively good properties in terms of their stabilities, process-abilities and resist removing performances.

Meanwhile, one of the recent tendencies of semiconductor device manufacturing processes is treating various substrates including a silicon wafer at a high temperature, i.e., making the temperature conditions of a hard-bake process high. However, said resist strippers do not have sufficient capability for removing resists that are hard-baked at a high temperature. As compositions for removing the hard-baked resists, aqueous resist strippers containing water have been suggested. As examples, a resist stripper composition comprising a) hydroxylamines, b) alkanol amines, and c) water (Japanese Laid-open Patent Publication No. Hei 4-289866; a resist stripper composition comprising a) hydroxylamines, b) alkanol amines, c) water and d) an anti-corrosive (Japanese Laid-open Patent Publication No. Hei 6-266119); a resist stripper composition comprising a) polar solvents such as GBL, DMF, DMAc, NMP, etc., b) aminoalcohols such as 2-methylaminoethanol, and c) water (Japanese Laid-open Patent Publication No. Hei 7-69618); a stripper composition comprising a) aminoalcohols such as monoethanolamine (MEA), b) water, and c) butyldiglycol (Japanese Laid-open Patent Publication No. Hei 8-123043); a resist stripper composition comprising a) alkanolamines, alkoxyamines, b) glycol monoalkyl ether, c) sugar alcohols, d) quaternary ammonium hydroxide, and e) water (Japanese Laid-open Patent Publication No. Hei 8-262746); a stripper composition comprising a) one or more alkanolamines of monoethanolamine (MEA) or AEE, b) hydroxylamine, c)

diethyleneglycol monoalkyl ether, d) sugars (sorbitol), and e) water (Japanese Laid-open Patent Publication No. Hei 9-152721); a resist stripper composition comprising a) hydroxylamines, b) water, c) amines having an acid dissociation constant (pKa) of 7.5 to 13, d) water soluble organic solvent, and e) an anticorrosive (Japanese Laid-open Patent Publication No. Hei 9-96911) have been suggested. However, it has been found that these stripper compositions also cannot sufficiently remove side wall resist polymers that are exposed to and modified by plasma gases during dry etching or an ashing process used to manufacture very large size integrated circuits. Accordingly, there is a need for the development of a resist stripper that can be used in the dry etching process so as to solve these problems.

As explained, resists that has been passed dry etching process are difficult to remove with general resist strippers. The surface of resists is cured mainly due to reaction heat by high-energy ion beams and a high radiation dose. At the same time, popping of resists occurs and generates resist residue. Commonly, semiconductor wafers to be ashing-treated are heat treated at a high temperature of 200° C. or more. At this time, solvents remaining inside resists should be evaporated and exhausted, which is not possible because a cured layer exists on the resist surface after the ashing process.

Accordingly, as ashing proceeds, internal pressure of the resist film increases and the surface of the resist film ruptures from the solvent remaining inside, which is referred to as popping. The surface-cured layer dispersed by such popping becomes residue and it is difficult to remove using general stripper compositions. Thus such modified resists have residue and particles deposits that are contaminants, and this lowers the production yield of very large size integrated circuit manufacture. Particularly, when the ashing process precedes the stripping process in order to remove resists, resist layers are seriously modified and thereby cause inferiority during the stripping process.

Many etching processes for removing the above-mentioned modified and cured resist layers have been suggested, one of which is a two-step ashing method comprising conducting a common ashing process and following with a second ashing process, as described in Fujimura, Japanese Spring Application Physical Society Announcement, 1P-13, p574, 1989. However, these processes are complicated, thery demand a lot of equipment, and they lower production yield.

Consequently, in order to solve these problems, there is no alternative but to conducting the stripping process using an aqueous resist stripper composition, one of which is a resist stripper composition comprising hydroxylamine, alkanol amine, an anticorrosive and water, which is widely used due to its relatively effective removing performance for modified and cured resist polymers. However, this composition shows a serious undercut phenomenon due to the corrosion of metal film materials that are applied in semiconductor production lines of 64 mega DRAM or more. Accordingly, there is a need for a novel resist stripper for compensating for these problems.

SUMMARY OF THE INVENTION

It is an object of the present invention to provide a resist stripper composition that can easily and quickly remove side-wall resist polymers that are modified and cured by dry etching and ashing processes as well as those produced by metal side products etched from metal film material during said processes, particularly from titanium nitride film materials and which can minimize the corrosion of lower metal film material.

In order to achieve these objects, the present invention provides a resist stripper composition comprising a) 3 to 10 wt % of organic amine compounds, b) 30 to 60 wt % of solvents selected from a group consisting of DMAc, DMF, DMI and NMP, c) 30 to 60 wt % of water, d) 1 to 10 wt % of catechol, resorcin or a mixture thereof, and e) 1 to 10 wt % of a C1–4 straight chain polyhydric alcohol.

In the resist stripper composition according to the present invention, an amino alcohol compound is used as the organic amine compound, and the amino alcohol compound is selected from a group consisting of monoethanolamine, 2-(2-aminoethoxy)ethanol, and monoisopropanolamine.

The organic amine compound is preferably contained in an amount of 3 to 10 wt %. Specifically, if the content of the organic amine compound is less than 3 wt %, it will be difficult to completely remove a resist polymer modified by dry etching and ashing processes, and if the content exceeds 10 wt %, the lower metal film materials such as aluminum and aluminum alloy will be excessively corroded.

The resist stripper composition of the present invention preferably comprises 30 to 60 wt % of solvents such as DMAc, DMF, NMP, DMI, etc. If the content of the solvent is less than 30 wt %, the solubility for stripped resist polymers will be lowered, and if the content exceeds 60 wt %, when used for a long time, the ingredients of the composition will change to lower the solubility of the resist due to the low boiling point properties of solvents such as DMAc, DMF, DMI, NMP, etc.

In the resist stripper composition according to the present invention, the water is preferably pure water filtered through ion exchange resin, and more preferably deionized water with a resistivity of 18 MΩ.

The content of water is preferably 30 to 60 wt %. If the water content is less than 30 wt %, the organic amine compound cannot be activated and thus the capability of removing resists will be lowered, and if the water content exceeds 60 wt %, the contents of the a) organic amine compound and the b) solvents such as DMAc, DMF, DMI, NMP, etc., will be comparatively decreased and thus the capability of removing resist will be lowered. Results of studies have confirmed that the water content is most preferably 30 to 60 wt %.

In the resist stripper composition according to the present invention, the catechol, resorcin or a mixture thereof effectively infiltrates hydroxide ions generated by the reaction of organic amine compounds and hydrogen ions of water into the contact surface between a resist film and a substrate. In addition, the catechol, resorcin or a mixture thereof also prevents hydroxide groups generated from the resist stripper composition from corroding the conductive lower metal film material.

The content of the catechol, resorcin or a mixture thereof is preferably 1 to 10 wt %. If the content of the catechol, resorcin or a mixture thereof is less than 1 wt %, the lower metal layer material will be deeply corroded, and if the content exceeds 10 wt %, the viscosity of the resist stripper composition will increase and thus convenience during use will be lowered.

In the resist stripper composition according to the present invention, the content of the C4–6 straight chain polyhydric alcohol is preferably 1 to 10 wt %. If the content of the C4–6 straight chain polyhydric alcohol is less than 1 wt %, it will be difficult to completely remove side wall resist polymers caused by titanium nitride film material, and if the contents exceeds 10 wt %, lower metal film materials such as aluminum and aluminum alloy will be seriously corroded. Although the organic amine compound alone allows resist polymer removing performance in the resist stripper composition of the present invention, it cannot completely remove the side-wall resist polymers generated in the side wall of titanium nitride of the lower metal film material.

As a result of studies, it has been discovered that the side-wall resist polymers generated from the side of titanium nitride can be removed by mixing C4–6 straight chain polyhydric alcohol with the organic amine compound.

In addition, as the C4–6 straight polyhydric alcohol, D-xylitol, sorbitol, threosol, etc. are preferable, and D-xylitol is more preferable.

DETAILED DESCRIPTION AND THE PREFERRED EMBODIMENTS

Figure 1:
FIG. 1 is a scan electron microscope (SEM) photo of a sectional structure of a pattern, after coating resist (6) on a substrate in which an aluminum alloy metal film (1), titanium nitride layer (2), tetraethyl orthosilicate (TEOS) (3), flowable oxide (FOX) (4), and tetraethyl orthosilicate (TEOS) (5) are laminated in that order and forming via hole patterns, and before dry etching and ashing.

The present invention will be explained in more detail with reference to the following examples. However, the scope of the present invention is not limited to the following Examples. In addition, unless specially indicated, the % and mixing ratio is based on weight.

In the Examples and Comparative Examples of the present invention, the performance evaluation for resist stripper compositions was conducted by the following method.

(1) Resist removal test

The preparation of Sample A

On the surface of an 8 inches silicon wafer on which aluminum alloy and titanium nitride films were deposited respectively to 800 Å and 150 Å, TEOS, FOX, and TEOS again were deposited using CVD (chemical vaporization deposition) equipment. A commonly used positive resist composition (product of Don-Jin Semichem, Trade name: DPR-i900) was spin coated such that the final thickness of the film reached 1.2 $\mu$m. Then, the resist film was pre-baked on a hot plate at 110° C. for 90 seconds. Predetermined via-hole pattern masks were placed on the resist film, and then the film was light-exposed and developed with a 2.38% tetramethyl ammonium hydroxide (TMAH) developer at 21° C. for 60 seconds, and the samples on which the via-hole patterns form were hard-baked on a hot plate at 120° C. for 100 seconds. The lower titanium nitride film that was not covered by the resist pattern was etched using the resist formed on the sample as a mask, with a dry etching apparatus using a $SF_6/Cl_2$ gas mixture as a dry etching gas (Hitachi Company, Model name: M318) for 35 seconds. Then, most of resists was removed using an ashing apparatus using $O_2$ plasma to complete the sample.

Resist removal test

Sample A was immersed in the resist stripper composition at 70° C. for 10 minutes. Then, the sample was taken out of the resist stripper composition, and it was rinsed with deionized water and dried with nitrogen gas. It was then examined using a SEM to determine whether or not resist polymers remained on the surface of a side-wall of a hole pattern section. The resist removal performance was evaluated according to the following standards and the results are presented in Table 2.

○: Resist residues were completely removed from the via-hole pattern side-wall.

Δ: 50% or more of resist residues were removed from the via-hole pattern side-wall but small amount thereof remained.

×: Most resist residues were not removed from the via-hole pattern side-wall.

(2) Metal film material corrosion test

Preparation of Sample B

Sample B was prepared by the same method as Sample A.

Metal film material corrosion test

Sample B was immersed in a resist stripper composition at 70° C. for 10 minutes and 20 minutes, respectively. Then, the sample was taken out of the resist stripper composition, and it was rinsed with deionized water and dried with nitrogen gas. It was then examined using a SEM to determine whether or not undercut had occurred in the lower metal film material of a pattern section. The degree of corrosion was evaluated on the basis of the following standards and the results are presented in Table 3.

○: No undercut in lower metal film material

Δ: Some undercut in lower metal film material

×: Serious undercut in lower metal film material

Examples 1 to 4 and Comparative Examples 1 and 2

The ingredients a) to e) were mixed in the ratio of Table 1 to prepare resist stripper compositions of Examples 1 to 4 and Comparative Examples 1 and 2, respectively. The thus obtained resist stripper compositions were tested for (1) resist removal, and (2) metal film material corrosion, and the results are presented in the following Tables 2 and 3.

TABLE 1

| | | a) organic amine compound | | b) organic solvent | | c) water | d) organic phenol compound | | e) D-xylitol |
|---|---|---|---|---|---|---|---|---|---|
| | | type | content | type | content | content | type | content | Content |
| Example | 1 | MEA | 5 | NMP | 30 | 50 | Catechol | 10 | 5 |
| | 2 | MEA | 5 | DMAc | 45 | 40 | Catechol | 5 | 5 |
| | 3 | AEE | 3 | DMAc | 50 | 30 | Catechol | 7 | 10 |
| | 4 | MIPA | 10 | DMA | 30 | 50 | Resorcin | 7 | 3 |
| Comparative | 1 | AEE | 40 | DMSO | 15 | 20 | Resorcin | 5 | — |
| | | HDA | 20 | | | | | | |

TABLE 1-continued

Compositional ratio of resist remover composition (wt %)

| | | a) organic amine compound | | b) organic solvent | | c) water | d) organic phenol compound | | e) D-xylitol |
|---|---|---|---|---|---|---|---|---|---|
| | | type | content | type | content | content | type | content | Content |
| Example | 2 | MIPA | 12 | NMP | 50 | — | — | — | TEG 2 |
| | | | | Sulforane | 28 | | | | |
| | | | | carbitol | 8 | | | | |

MIPA: monoisopropanolamine
MEA: monoethanolamine
AEE: 2-(2-aminoethoxy)ethanol
TEG: tetraethyleneglycol

TABLE 2

Resist side-wall polymer removal performance of resist stripper composition

| Immersion time | | 10 minutes | 20 minutes |
|---|---|---|---|
| Example | 1 | ○ | ○ |
| | 2 | ○ | ○ |
| | 3 | ○ | ○ |
| | 4 | ○ | ○ |
| Comparative Example | 1 | x | Δ |
| | 2 | x | x |

Figure 2:
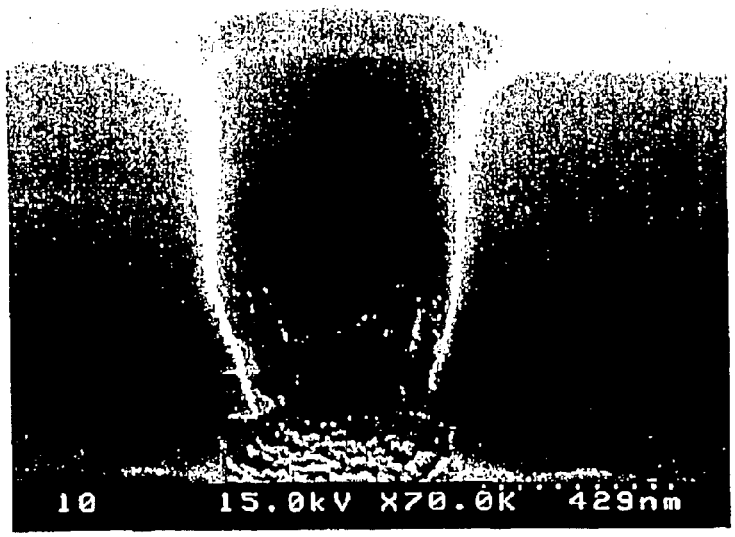
FIG. 2 is an SEM photo showing results of conducting a resist removing performance test at 70° C. using the resist stripper composition of Comparative Example 2 after ashing the pattern to partially remove the resist (6).
Figure 3:
FIG. 3 is an SEM photo showing the results of conducting a resist removing performance test at 70° C. using the resist stripper composition of Example 1, after ashing the pattern to partially remove the resist (6).

FIGS. 1 to 3 are SEM (Hitachi Company, Model name: S-4100) photos comparing the resist removal performance of the resist stripper composition of Example 1 and those of Comparative Example 2. FIGS. 1 to 3 show results of testing Sample A at 70° C.

FIG. 1 is a SEM photo of the section structure of a pattern, before dry etching and ashing, after coating resist on a substrate in which alloy metal film (1), titanium nitride film (2), tetraethyl orthosilicate (TEOS) (3), flowable oxide (FOW) (4) and TEOS are laminated in that order and forming via hole patterns.

FIG. 2 is a SEM photo showing results of a resist removal performance test at 70° C. using the resist stripper composition of Comparative Example 2, after ashing the pattern of FIG. 1 to remove a part of the resist (6).

FIG. 3 is a SEM photo showing results of a resist removal performance test at 70° C. using the resist stripper composition of Example 1, after ashing patterns of FIG. 1 to remove a part of the resist (6).

TABLE 3

| Immersion Time | | 10 minutes | 20 minutes |
|---|---|---|---|
| Example | 1 | ○ | ○ |
| | 2 | ○ | ○ |
| | 3 | ○ | ○ |
| | 4 | ○ | ○ |
| Comparative Example | 1 | x | Δ |
| | 2 | x | x |

As above, the resist stripper composition according to the present invention can easily and quickly remove resist polymer cured by dry etching, ashing ion injection processes and side-wall resist polymer modified by metallic side-products caused by lower metal film material during said processes. In addition, the resist stripper composition of the present invention can minimize corrosion of lower metal wiring, particularly aluminum wiring during the resist removal process, and it can be rinsed with water without using organic solvents such as isopropylalcohol, dimethyl-sulfoxide in a subsequent rinsing process.

What is claimed is:

1. A resist stripper composition comprising a) 3 to less than 10 wt % of an organic amine compound, b) 30 to 60 wt % of a solvent selected from a group consisting of N,N-dimethylacetamide (DMAc), N,N-dimethylformamide (DMF), 1,3-dimethyl-2-imidazolinone (DMI) and N-methylpyrrolidone (NMP), c) 30 to 60 wt % of water, d) 1 to 10 wt % of catechol, resorcin or a mixture thereof, and e) 1 to 10 wt % of a C4–6 straight polyhydric alcohol.

2. The resist stripper composition according to claim 1, wherein the organic amine compound is an amino alcohol compound.

3. The resist stripper composition according to claim 2, wherein the amino alcohol compound is selected from a group consisting of monoethanolamine, 2-(2-aminoethoxy)ethanol, monoisopropanolamine and a mixture thereof.

4. The resist stripper composition according to claim 1, wherein the straight polyhydric alcohol is D-Xylitol.

* * * * *